United States Patent
Hiramatsu et al.

(10) Patent No.: US 7,127,812 B2
(45) Date of Patent: Oct. 31, 2006

(54) PROCESS FOR PRODUCING A MULTI-LAYER PRINTED WIRING BOARD

(75) Inventors: Yasuji Hiramatsu, Ibi-gun (JP); Motoo Asai, Ibi-gun (JP); Naohiro Hirose, Ibi-gun (JP); Takashi Kariya, Ibi-gun (JP)

(73) Assignee: IBIDEN Co., Ltd., Ogaki (JP)

( * ) Notice: Subject to any disclaimer, the term of this patent is extended or adjusted under 35 U.S.C. 154(b) by 344 days.

(21) Appl. No.: 10/406,245

(22) Filed: Apr. 4, 2003

(65) Prior Publication Data

US 2003/0192182 A1 Oct. 16, 2003

Related U.S. Application Data

(62) Division of application No. 09/581,298, filed as application No. PCT/JP98/05398 on Nov. 30, 1998, now Pat. No. 6,609,297.

(30) Foreign Application Priority Data

Dec. 11, 1997 (JP) ............................... H9-362132

(51) Int. Cl.
*H01K 3/10* (2006.01)
(52) U.S. Cl. ................. 29/852; 29/593; 29/610.1; 29/612; 29/830; 29/846; 29/847; 156/89.18; 174/255; 174/256; 219/121.68; 219/121.69; 427/97.2; 427/97.5
(58) Field of Classification Search ............... 29/852, 29/593, 610.1, 612, 830, 847, 846; 156/89.18; 174/255, 256; 219/121.68, 121.69; 427/97.2, 427/97.5
See application file for complete search history.

(56) References Cited

U.S. PATENT DOCUMENTS

| | | | |
|---|---|---|---|
| 4,510,276 A * | 4/1985 | Leech et al. | 523/427 |
| 4,642,160 A | 2/1987 | Burgess | |
| 5,055,321 A * | 10/1991 | Enomoto et al. | 427/97.2 |
| 5,073,687 A | 12/1991 | Inagawa | |
| 5,263,243 A | 11/1993 | Taneda | |
| 5,278,385 A * | 1/1994 | Gerome et al. | 219/121.68 |
| 5,401,909 A | 3/1995 | Arnold | |
| 5,517,758 A | 5/1996 | Nakamura | |
| 6,000,124 A | 12/1999 | Saito | |
| 6,035,526 A | 3/2000 | Saruta | |

FOREIGN PATENT DOCUMENTS

| | | |
|---|---|---|
| GB | 2 307 352 | 5/1997 |
| JP | 03-054884 A | 3/1991 |

(Continued)

*Primary Examiner*—A. Dexter Tugbang
*Assistant Examiner*—Tim Phan
(74) *Attorney, Agent, or Firm*—Oblon, Spivak, McClelland, Maier & Neustadt, P.C.

(57) ABSTRACT

A board 20 is provided with a Cu film 30 as a conformal mask, in which are formed a register mark 30*b* and an opening 3*a* through which a via hole is formed. A camera senses this register mark 30*b* so that the position of the board 30 is determined. A laser beam is directed to the approximate position of the opening 30*a*, so that the opening 26*a* through which the via hole is drilled is formed. The accuracy of the position of the opening of the via hole depends on the accuracy of the position of the opening 30*a* in the Cu film 30 as the conformal mask. Therefore, the via hole can be formed at an adequate position despite the low accuracy of the position for laser irradiation.

30 Claims, 12 Drawing Sheets

FOREIGN PATENT DOCUMENTS

| | | |
|---|---|---|
| JP | 403048488 A | 3/1991 |
| JP | 4-162494 | 6/1992 |
| JP | 05020031 | 2/1993 |
| JP | 8-340165 | 12/1996 |
| JP | 9-29473 | 2/1997 |
| JP | 9-308981 | 12/1997 |
| JP | 10-200269 | 7/1998 |

* cited by examiner

Fig.8
(A)
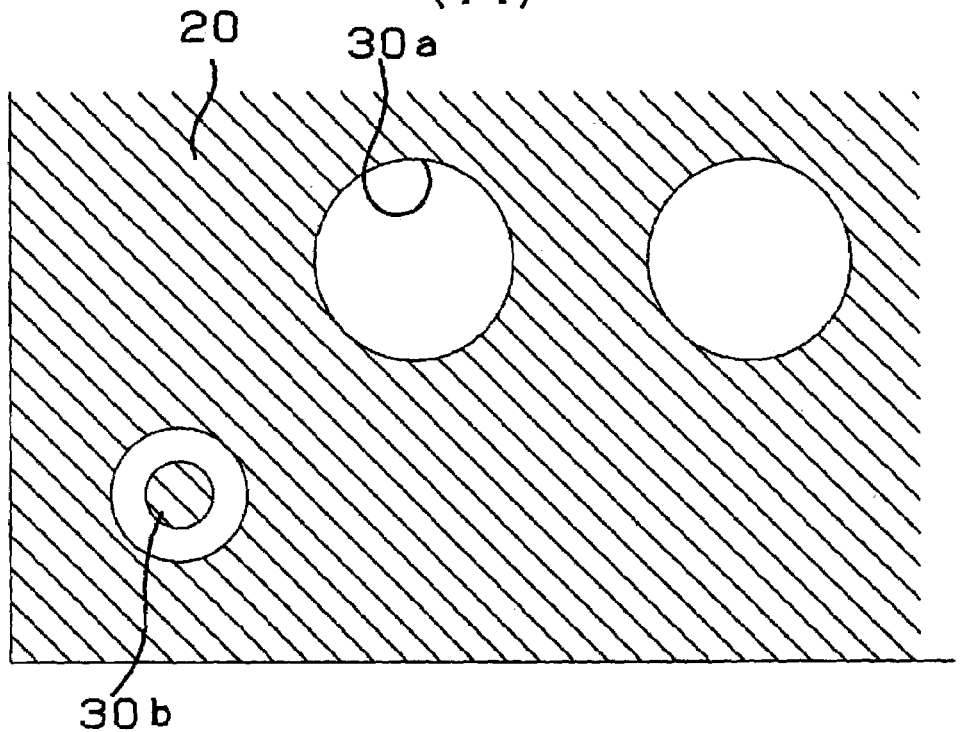
(B)
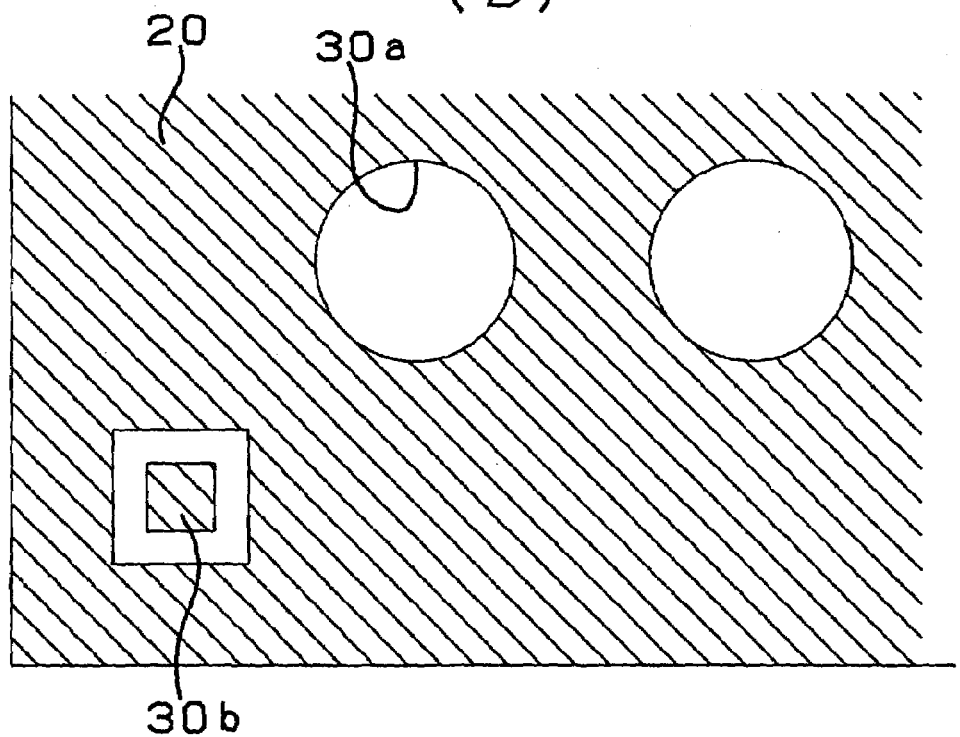

Fig. 11
(A) 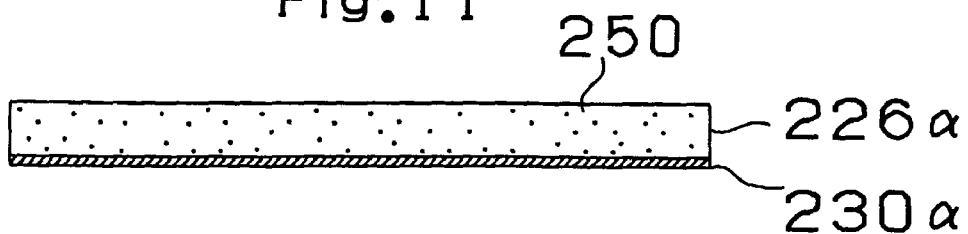
(B) 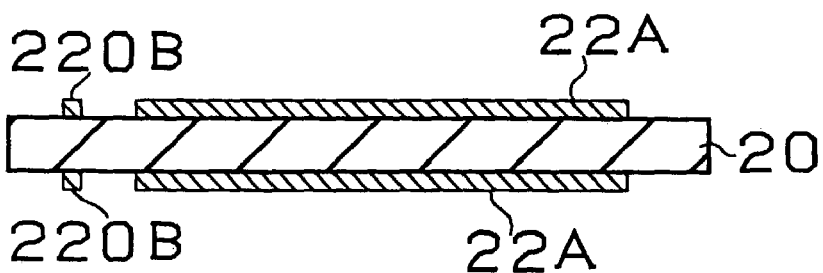
(C) 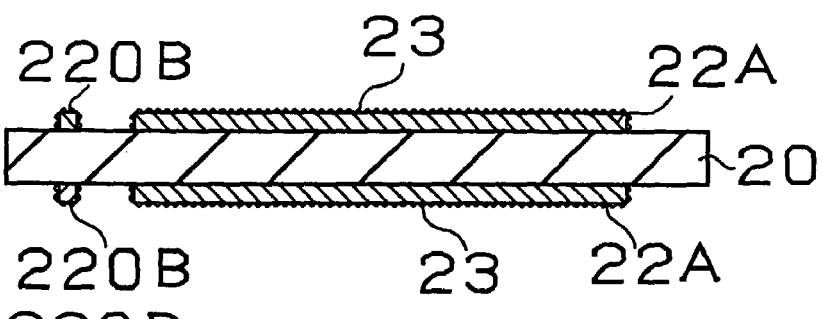
(D) 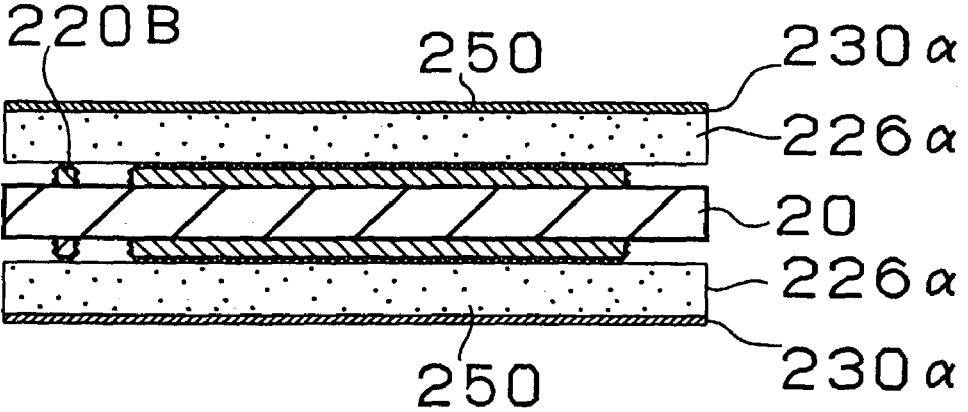
(E) 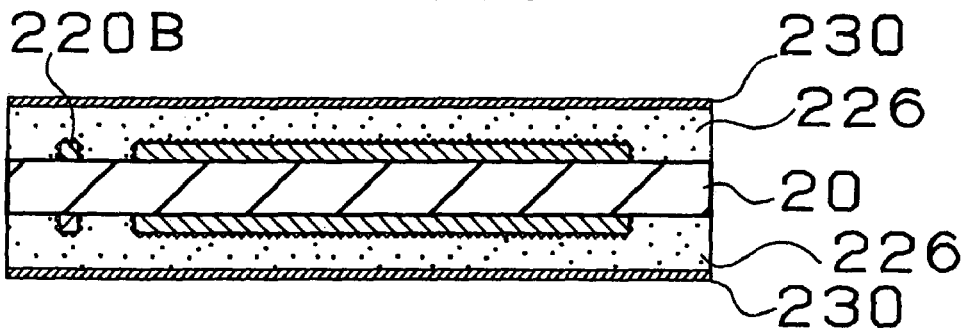

Fig. 12
(F)
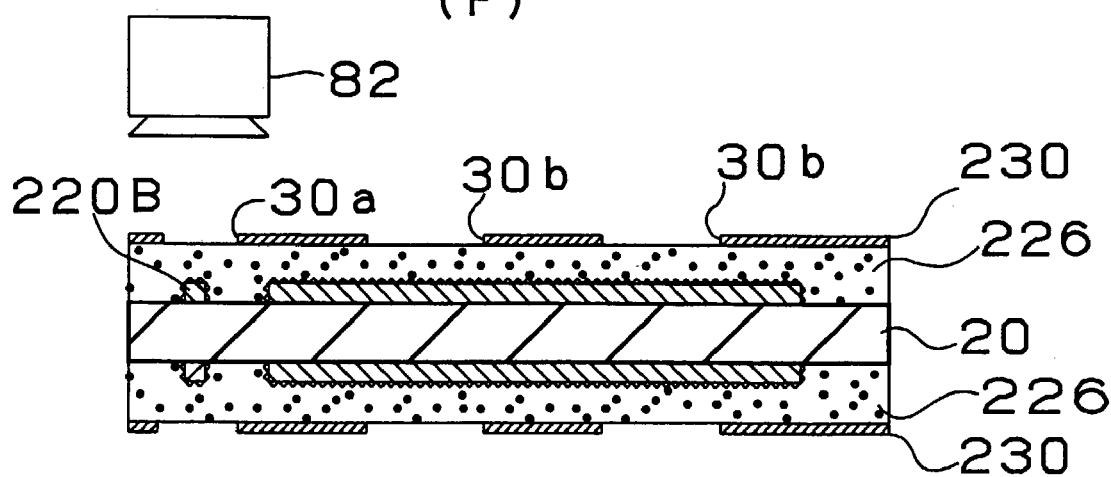
(G)
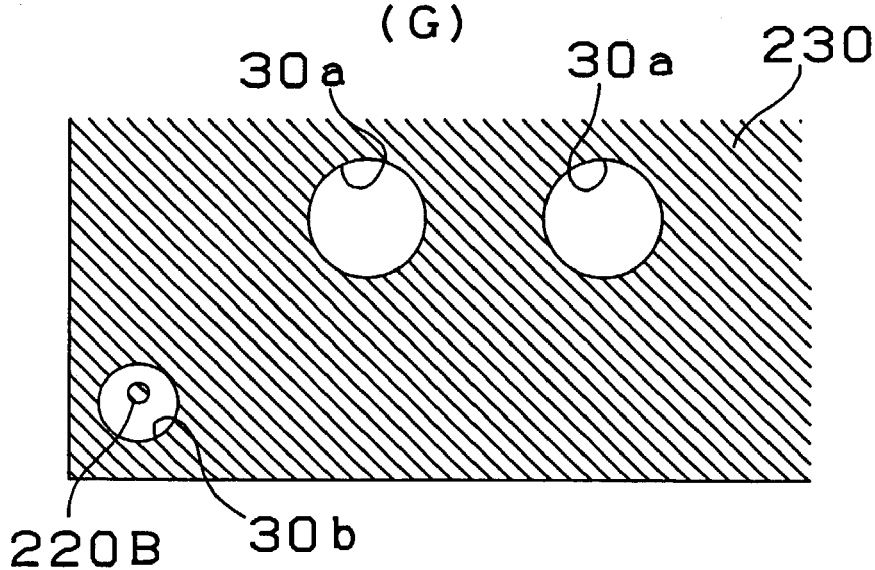
(H)
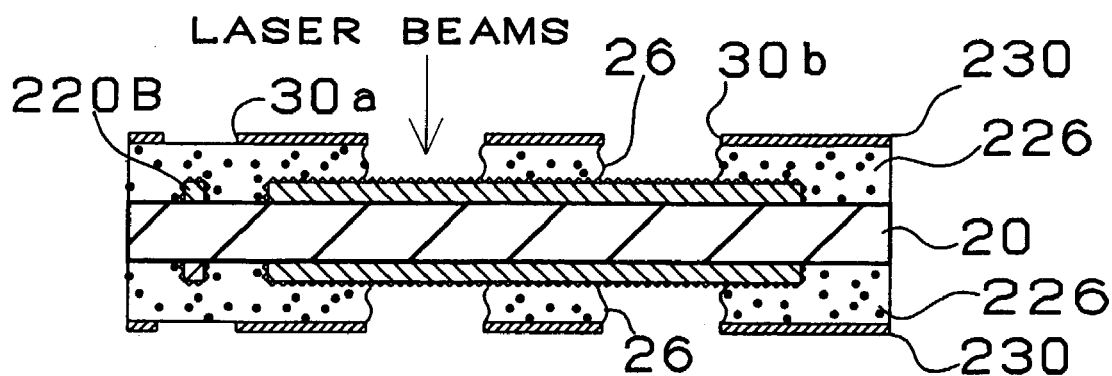

PROCESS FOR PRODUCING A MULTI-LAYER PRINTED WIRING BOARD

The present application is a division of application Ser. No. 09/581,298, filed on Jun. 12, 2000, now U.S. Pat. No. 6,609,297, which is a 371 of International Application No. PCT/JP98/05398, filed Nov. 30, 1998, which claims priority to Japanese Application No. H9-362132, filed on Dec. 11, 1997.

TECHNICAL FIELD

The present invention relates to a process for producing a multi-layer printed wiring board, said process permitting mass production of a multi-layer printed wiring board with small-diameter via holes. Increased productivity is made possible, by driving the galvano head at a higher speed.

BACKGROUND ART

A build-up multilayer wiring board alternately has interlayer resin insulators and conductive circuit layers, provides holes to the interlayer resin insulator layers, and then electrically connects the upper layers and lower layers by forming conductive films on the surface of the walls of these holes.

A hole (via hole) in the interlayer resin insulating layer is generally formed with the use of an exposure and developing process, which gives photosensitive property to the interlayer resin.

However, the required diameter of these via holes in a multilayer printed wiring board is almost 100 µm or less, thus it is necessary to develop technology which makes it possible to maintain this small diameter. Due to such stringent requirements, the employment of a processing method utilizing a laser beam for the boring of the holes in the build-up multilayer wiring board will now be investigated.

Technology using laser for boring is proposed, in JPA HEI 3-54884. According to this method, a light beam from a laser source is received by a processing head for deflection. Thereby, the laser beam is irradiated to a predetermined resin insulator to form a hole.

In mass production of multi-layer printed wiring boards, which have hundreds to thousands of via holes in each layer, efficient hole drilling is essential. In addition, via holes need accurate positioning for electrical connection to conductor circuits in the layers below.

Unfortunately, it has been difficult to control, with high accuracy, the position of laser irradiation for via hole drilling in mass production. This has aroused a need for a process for fabricating a multi-layer printed wiring board containing openings at accurate positions. However, the current method of manufacture can not guarantee accurate positioning of laser irradiation. Improvement in positioning accuracy is offset by a necessary decrease in head driving speed, which in turn lowers productivity.

The present invention aims to address the above-mentioned problems. It is an object of the present invention to provide a process for producing a multi-layer printed wiring board, said process permitting accurate positioning of via holes independent of the accuracy of position for laser irradiation, thereby drilling a large number of holes efficiently by laser irradiation.

It is another object of the present invention to provide a method for increasing the driving speed of the scanning head without decreasing the accuracy of positions of via holes.

DISCLOSURE OF THE INVENTION

In order to achieve the aforementioned objectives, one embodiment according to the present invention provides a process for producing a multi-layer printed wiring board, which comprises the following steps (a) to (c).

(a) forming an interlayer insulating resin layer having a metal film, an opening formed on the metal film and a register mark on the surface thereof on a board covered with a conductor layer, (b) removing that part of the interlayer insulating resin layer which is exposed through the opening in said metal film, by irradiation of a laser beam aimed at the opening according to data obtained by sensing the position of the register mark, thereby forming an opening through which a via hole is formed, and (c) forming via holes and conductor circuits.

In order to achieve the invention's objectives, another embodiment according to the present invention provides a process for producing a multi-layer printed wiring board, which comprises the following steps (a) to (c).

(a) forming an interlayer insulating resin layer on a board covered with a conductor layer, (b) forming a metal film, an opening formed on the metal film and a register mark on the surface of said interlayer insulating resin layer, and (c) removing that part of the interlayer insulating resin layer which is exposed through the opening in said metal film, by irradiation of a laser beam aimed at the opening according to data obtained by sensing the position of the register mark, thereby forming the opening through which a via hole is formed.

In order to achieve the invention's objectives, another embodiment according to the present invention provides a process for producing a multi-layer printed wiring board, which comprises the following steps (a) to (d).

(a) placing a metal-clad resin film on a board covered with a conductor layer and performing hot-pressing, thereby forming an interlayer insulating resin layer having a metal film on the surface thereof, (b) forming an opening and a register mark on said metal film, (c) removing that part of the interlayer insulating resin layer which is exposed through the opening in said metal film, by irradiation of a laser beam aimed at the opening according to data obtained by sensing the position of the register mark, thereby forming the opening through which a via hole is formed, and (d) forming a via hole and a conductor circuit.

In order to achieve the invention's objectives, another embodiment according to the present invention provides a process for producing a multi-layer printed wiring board, which comprises the following steps (a) to (f).

(a) forming an interlayer insulating resin layer having a metal film, an opening formed on the metal film and a register mark on the surface thereof on a board covered with a conductor layer, (b) removing that part of the interlayer insulating resin layer which is exposed through the opening in said metal film, by irradiation of a laser beam aimed at the opening according to data obtained by sensing the position of the register mark, thereby forming the opening through which a via hole is formed, (c) forming a film by electroless plating on the board obtained in step (b) above, (d) forming a plating resist on the board obtained in step (c) above, (e) performing electrolytic plating on the part where said plating resist is not formed, and (f) removing said plating resist and, removing by etching, the metal film and electrolessly plated film under the plating resist, thereby forming a via hole and a conductor circuit.

In order to achieve the invention's objectives, another embodiment according to the present invention provides a process for producing a multi-layer printed wiring board, which comprises the following steps (a) to (h).

(a) forming an interlayer insulating resin layer on a board covered with a conductor layer, (b) forming a metal film on the surface of the interlayer insulating resin layer, (c) forming an opening and a register mark on said metal film, (d) removing that part of the interlayer insulating resin layer which is exposed through the opening in said metal film, by irradiation of a laser beam aimed at the opening according to data obtained by sensing the position of the register mark, thereby forming the opening through which a via hole is formed, (e) forming a film by electroless plating on the board obtained in step (d) above, (f) forming a plating resist on the board obtained in step (e) above, (g) performing electrolytic plating on the part where said plating resist is not formed, and (h) removing said plating resist and, removing by etching, the metal film and electrolessly plated film under the plating resist.

In order to achieve the invention's objectives, another embodiment according to the present invention provides a process for producing a multi-layer printed wiring board, which comprises the following steps (a) to (g).

(a) placing a metal-clad resin film on a board covered with a conductor layer and performing hot-pressing, thereby forming an interlayer insulating resin layer having a metal film on the surface thereof, (b) forming an opening and a register mark on said metal film, (c) removing that part of the interlayer insulating resin layer which is exposed through the opening in said metal film, by irradiation of a laser beam aimed at the opening according to data obtained by sensing the position of the register mark, thereby forming the opening through which a via hole is formed, (d) forming a film by electroless plating on the board obtained in step (c) above, (e) forming a plating resist on the board obtained in step (d) above, (f) performing electrolytic plating on the part where said plating resist is not formed, and (g) removing said plating resist and, removing by etching, the metal film and electrolessly plated film under the plating resist, thereby forming a via hole and a conductor circuit.

In order to achieve the invention's objectives, another embodiment according to the present invention provides a process for producing a multi-layer printed wiring board, which comprises the following steps (a) to (c).

(a) forming an interlayer insulating resin layer having a metal film, openings formed on the metal film, and register marks on the surface thereof on a board covered with a conductor layer, (b) placing said board with said register marks on a table of an apparatus for producing a multi-layer printed wiring board, said apparatus including; an emitter of fabricating laser, a scanning head to deflect the direction of the laser beam in X-Y directions, a camera to sense the register mark on the board, a table to support the board, an entry part for entrance of data for fabricating the board, a memory to store fabricating data or computed results, and an operation part, entering processing data into said apparatus, sensing the position of the register mark on the board by means of the camera and comparing the results of sensing with previously entered processing data, thereby generating in the operation part, data necessary to drive the scanning head, the table, and storing the data in memory, irradiating the openings in said metal film with a laser beam, with the scanning head and table controlled by the control part which reads the driving data from memory, thereby removing the interlayer resin layer and forming openings through which via holes are formed, and (c) forming via holes and conductor circuits.

In order to achieve the invention's objectives, another embodiment according to the present invention provides a process for producing a multi-layer printed wiring board, which comprises the following steps (a) to (c).

(a) forming an interlayer insulating resin layer on a board covered with a conductor layer, (b) forming a metal film, openings formed on the metal film, and register marks on the surface of said interlayer insulating resin layer, and (c) placing said board with said register marks on a table of an apparatus for producing a multi-layer printed wiring board, said apparatus including; an emitter of fabricating laser, a scanning head to deflect the direction of the laser beam in X-Y directions, a camera to sense the register mark on the board, a table to support the board, an entry part for entrance of data for fabricating the board, a memory to store fabricating data or computed results, and an operation part, entering processing data into said apparatus, sensing the position of the register mark on the board by means of the camera and comparing the results of sensing with previously entered processing data, thereby generating in the operation part, data necessary to drive the scanning head, the table, and storing the data in memory, irradiating the openings in said metal film with a laser beam, with the scanning head and table controlled by the control part which reads the driving data from memory, thereby removing the interlayer resin layer and forming openings through which via holes are formed.

In order to achieve the invention's objectives, another embodiment according to the present invention provides a process for producing a multi-layer printed wiring board, which comprises the following steps (a) to (d).

(a) placing a metal-clad resin film on a board covered with a conductor layer and performing hot-pressing, thereby forming an interlayer insulating resin layer having a metal film on the surface thereof, (b) forming openings and register marks on said metal film, (c) placing said board with said register marks on a table of an apparatus for producing a multi-layer printed wiring board, said apparatus including; an emitter of fabricating laser, a scanning head to deflect the direction of the laser beam in X-Y directions, a camera to sense the register mark on the board, a table to support the board, an entry part for entrance of data for fabricating the board, a memory to store fabricating data or computed results, and an operation part, entering processing data into said apparatus, sensing the position of the register mark on the board by means of the camera and comparing the results of sensing with previously entered processing data, thereby generating in the operation part, data necessary to drive the scanning head, the table, and storing the data in memory, irradiating the openings in said metal film with a laser beam, with the scanning head and table controlled by the control part which reads the driving data from memory, thereby removing the interlayer resin layer and forming openings through which via holes are formed, and (d) forming via holes and conductor circuits.

In order to achieve the invention's objectives, another embodiment according to the present invention provides a process for producing a multi-layer printed wiring board, which comprises the following steps (a) to (h).

(a) forming an interlayer insulating resin layer on a board covered with a conductor layer, (b) forming a metal film on said interlayer insulating resin layer, (c) forming openings and register marks in said metal film, (d) placing said board with said register marks on a table of an apparatus for producing a multi-layer printed wiring board, said apparatus including; an emitter of fabricating laser, a scanning head to deflect the direction of the laser beam in X-Y directions, a camera to sense the register mark on the board, a table to support the board, an entry part for entrance of data for fabricating the board, a memory to store fabricating data or computed results, and an operation part, entering processing data into said apparatus, sensing the position of the register mark on the board by means of the camera and comparing the results of sensing with previously entered processing data, thereby generating in the operation part, data necessary to drive the scanning head, the table, and storing the data in memory, irradiating the openings in said metal film with a laser beam, with the scanning head and table controlled by the control part which reads the driving data from memory, thereby removing the interlayer resin layer and forming openings through which via holes are formed, (e) forming an electrolessly plated film on the board obtained in said step (d), (f) forming a plating resist on the board obtained in said step (e), (g) performing electrolytic plating on the part where said plating resist is not formed, and (h) removing said plating resist and, removing by etching, the metal film and electrolessly plated film under the plating resist.

In order to achieve the invention's objectives, another embodiment according to the present invention provides a process for producing a multi-layer printed wiring board, which comprises the following steps (a) to (c).

(a) forming an interlayer insulating resin layer and a metal film on a board covered with a conductor layer, (b) forming an opening and a register mark on said metal film, and (c) removing that part of the interlayer insulating resin layer which is exposed through the opening in said metal film, by irradiation of a laser beam aimed at the opening according to data obtained by sensing the position of the register mark, thereby forming the opening through which a via hole is formed.

In order to achieve the invention's objectives, another embodiment according to the present invention provides a process for producing a multi-layer printed wiring board, which comprises the following steps (a) to (d).

(a) forming an interlayer insulating resin layer and a metal film on a board covered with a conductor layer, (b) forming openings and register marks on said metal film, (c) placing said board with said register marks on a table of an apparatus for producing a multi-layer printed wiring board, said apparatus including; an emitter of fabricating laser, a scanning head to deflect the direction of the laser beam in X-Y directions, a camera to sense the register mark on the board, a table to support the board, an entry part for entrance of data for fabricating the board, a memory to store fabricating data or computed results, and an operation part, entering processing data into said apparatus, sensing the position of the register mark on the board by means of the camera and comparing the results of sensing with previously entered processing data, thereby generating in the operation part, data necessary to drive the scanning head, the table, and storing the data in memory, irradiating the openings in said metal film with a laser beam, with the scanning head and table controlled by the control part which reads the driving data from memory, thereby removing the interlayer resin layer and forming openings through which via holes are formed, and (d) forming via holes and conductor circuits.

Another embodiment according to the present invention provides a process for producing a printed wiring board wherein said register mark is an opening formed in the metal film and the sensing of said register mark is accomplished by sensing the sub-layer mark which is visible in the opening formed in said metal film through the interlayer insulating resin film.

According to the present invention, via holes are drilled in the resin insulating layer, through openings made in a metal film attached thereto, by laser irradiation directed approximately to said openings in response to the board position sensed by a camera relative to the register marks inscribed on the metal film. (This metal film functions as a resist mask for the laser beam, and it is referred to as conformal mask hereinafter.)

In this way it is possible to form via holes at adequate positions even though the accuracy of position for laser irradiation is not high, because the accuracy of the position of via holes depends solely on the accuracy of the position of the openings in the metal film (or conformal mask).

In this way it is also possible to make hundreds to thousands of via holes efficiently owing to the register marks inscribed in the metal film having openings for via holes. These register marks permit the position of the board to be determined accurately relative to the scanning head (galvano head) whose movement has already been programmed. The resulting data controls the positioning of the table and scanning head.

According to the present invention, it is possible to employ laser irradiation without sacrificing the accuracy of the position of via holes even though the board is not located very accurately. This implies that the scanning head can move faster, making more via holes per unit time, which leads to improved productivity.

In the present invention, the register marks on the multilayer printed wiring board should ideally be inscribed on the metal film with the use of etching or the like. They may be circular, square, or rectangular in form.

Being opaque to light, the metallic register mark gives a silhouette when it is illuminated upward from the table or reflects light when it is illuminated downward. In other words, it can be recognized by the camera regardless of the direction from which it is illuminated.

The register marks should be inscribed at the same time as etching for openings on the metal film. This eliminates the necessity of performing two steps separately for making the openings and inscribing the register marks.

In another preferred embodiment, a sub-layer mark is formed on the surface of the board which is covered with an interlayer insulating resin layer and an opening (as the register mark) is formed in the metal film which functions as the conformal mask, as shown in FIGS. 11 and 12. The position is determined by sensing the sub-layer mark which is visible in the opening (or the register mark) through the resin layer. The advantage of this embodiment is that the sub-layer mark 220B, which is covered with a resin layer, does not oxidize to decrease in reflectivity, nor does it peel off (and hence it poses no problem with recognition in silhouette).

To be more concrete, the process consists of steps of forming the interlayer insulating resin layer, forming on it the metal film (which functions as the conformal mask) by physical or chemical vapor deposition or electroless plating or by hot-pressing a resin film covered with a metal film, and forming the register mark at the same time as the opening is formed by etching.

The above-mentioned interlayer insulating resin layer may be formed from a thermosetting resin or a thermoplastic resin or a combination thereof.

It may also be formed from an adhesive for electroless plating. In its most desirable form, the adhesive is composed of an uncured heat-resistant resin slightly soluble in acid or oxidizing agent and particles (dispersed therein) of a cured heat-resistant resin soluble in acid or oxidizing agent. Treatment with acid or oxidizing agent dissolves and removes the heat-resistant resin particles, thereby forming a rough surface with minute pits for anchorage.

The adhesive for electroless plating should preferably be one which contains the cured heat-resistant resin particles specified by any of the following, because it gives anchorage of a more complex structure.

(1) Heat-resistant resin particles which have an average particle diameter smaller than 10 μm.
(2) Agglomerate of heat-resistant resin powder having an average particle diameter smaller than 2 μm.
(3) A mixture of heat-resistant resin powder having an average particle diameter of 2–10 μm and heat-resistant resin powder having an average particle diameter smaller than 2 μm.
(4) Pseudo agglomerate of heat-resistant resin powder having an average particle diameter of 2–10 μm, each particle of which carries on its surface heat-resistant resin powder or inorganic powder or both having an average particle diameter smaller than 2 μm.
(5) A mixture of heat-resistant resin powder having an average particle diameter of 0.1–8 μm and heat-resistant resin powder having an average particle diameter larger than 0.8 μm and smaller than 2 μm.
(6) Heat-resistant resin powder which has an average particle diameter of 0.1–10 μm.

For good adhesion, the rough surface should ideally have a roughness of Rmax=0.01–20 μm. In the case of semi-additive process, the preferred roughness is 0.1–5 μm, which ensures good adhesion while permitting the electrolessly plated film to be removed.

The above-mentioned heat-resistant resin slightly soluble in acid or oxidizing agent should preferably be a "composite of thermosetting resin and thermoplastic resin" or a "composite of photosensitive resin and thermoplastic resin". The former is superior in heat resistance and the latter can be applied by photolithography to form the opening for the via hole.

The above-mentioned thermosetting resin includes, for example, epoxy resin, phenol resin, and polyimide resin. These chemicals may be made photosensitive if their thermosetting groups are modified with methacrylic acid or acrylic acid. Acryl-modified epoxy resin is most suitable.

The epoxy resin includes, for example, epoxy resins of phenol novolak type or cresol novolak type and alicyclic epoxy resins formed by modification with dicyclopentadiene.

The thermoplastic resin includes, for example, polyethersulfone (PES), polysulfone (PSF), polyphenylenesulfone (PPS), polyphenylene sulfide (PPES), polyphenyl ether (PPE), polyetherimide (PI), and fluoroplastics.

The mixing ratio of the thermosetting (photosensitive) resin to the thermoplastic resin should ideally be from 95/5 to 50/50, so that the resulting compound has good toughness without a loss in heat resistance.

The amount of the heat-resistant resin particles should be 5–50 wt %, preferably 10–40 wt %, of solids in the heat-resistant resin matrix.

The heat-resistant resin particles should preferably be those of amino resin (such as melamine resin, urea resin, and guanamine resin) and epoxy resin.

Incidentally, the adhesive may be composed of two layers, each differing in composition as explained later.

Forming an interlayer insulating resin layer and a metal film simultaneously is acceptable. In this case, the board having conductor layers formed thereon is hot-pressed together with a prepreg placed thereon, said prepreg being a thermosetting resin, a thermoplastic resin, or a composite of thermosetting resin and thermoplastic resin, which is impregnated into a fibrous substrate.

The fibrous substrate may be glass cloth or aramid fiber cloth.

Another acceptable process consists of placing a metal-clad resin film on the board having conductor layers formed thereon, performing hot-pressing, thereby forming the interlayer insulating resin layer and the metal film, and etching the metal film, thereby forming the opening and register mark.

The resin film mentioned above may be of thermosetting resin, thermoplastic resin, or a composite of thermosetting resin and thermoplastic resin.

The thermosetting resin includes, for example, one or more of the following; epoxy resin, polyimide resin, phenolic resin, bismaleimide triazine resin (BT). The thermoplastic resin includes, for example, one or more of the following; polyether sulfone (PES), polyether imide (PEI), polyphenylene ether (PPE), polyphenylene sulfide (PPS), and fluoroplastics. The thermoplastic resin should be used in the form of uncured resin film.

Hot-pressing may be performed at 100–150° C. and 5–50 kg/cm$^2$ for thermosetting resins and 100–350° C. and 5–100 kg/cm$^2$ for thermoplastic resins.

The resin film should ideally be 5–100 µm thick. Excessive thickness presents difficulties when hole drilling with a laser beam. Excessively thin films do not provide satisfactory interlayer insulation.

The metal film may be of one or more of the following metals; copper, nickel, aluminum, and precious metal (such as gold, silver, palladium, and platinum). Copper foil is the most desirable because of its low price and good resistance to laser beams.

The metal film should ideally be 1–20 µm thick. Excessive thickness does not yield fine patterns, and excessively thin films are easily damaged by laser beams.

In a preferred embodiment of the present invention, the metal film as the conformal mask is formed by physical or chemical vapor deposition. Through this mask, openings for via holes are formed with the use of a laser. On this metal film is formed a layer by electroless plating. On this layer is formed another layer by electrolytic plating. Incidentally, the electrolessly-plated layer should be given a plating resist prior to electrolytic plating. The electrolessly-plated layer under the plating resist is removed by etching when conductor circuits and via holes are formed. The plating resist protects the electrolytically plated layer used to form conductor circuits and via holes from damage by the etching process because the metal film and electrolessly plated layer are thin enough for easy removal. Thus it is possible to create wiring with a fine pitch and via holes with an extremely small diameter. Suitable etching solutions include aqueous solution of sulfuric acid and hydrogen peroxide, aqueous solution of ammonium persulfate, and aqueous solution of ferric chloride.

The physical or chemical vapor deposition may be accomplished by sputtering or vacuum deposition.

The deposited metal film and the electrolessly-plated film covering it should preferably be thinner than 2 µm. Such a thin film is easily removed by etching when conductor circuits and via holes are formed by removing unnecessary parts of the metal film and electrolessly plated layer. Therefore, the electrolytically plated layer used to form conductor circuits and via holes are not damaged by the etching process. Thus it is possible to create wiring with a fine pitch and via holes with an extremely small diameter.

In the present invention, it is permissible to form the metal film simultaneously with the interlayer insulating resin layer. This is achieved by laminating a prepreg and then performing hot pressing to cure the resin. (The prepreg is a glass fiber cloth or aramid fiber cloth impregnated with resin in B stage. A resin film may replace it in B stage.)

In this case, the steps shown in FIG. 4(D) and FIG. 5(E) are replaced by the steps shown in FIG. 9(D') and FIG. 9(E').

BRIEF DESCRIPTION OF THE FIGURES

FIG. 8(A) is a plan view showing the board having an annular register mark formed thereon. FIG. 8(B) is a plan view showing the board having a square register mark formed thereon.

FIGS. 11(A) to 11(E) are diagrams showing the process of producing a printed wiring board according to the first embodiment (with another modification) of the present invention.

FIGS. 12(F) to 12(H) are diagrams showing the process of producing a printed wiring board according to the first embodiment (with another modification) of the present invention.

BEST MODE FOR CARRYING OUT THE INVENTION

The embodiments of the present invention will be described with reference to the drawings.

Figure 1:
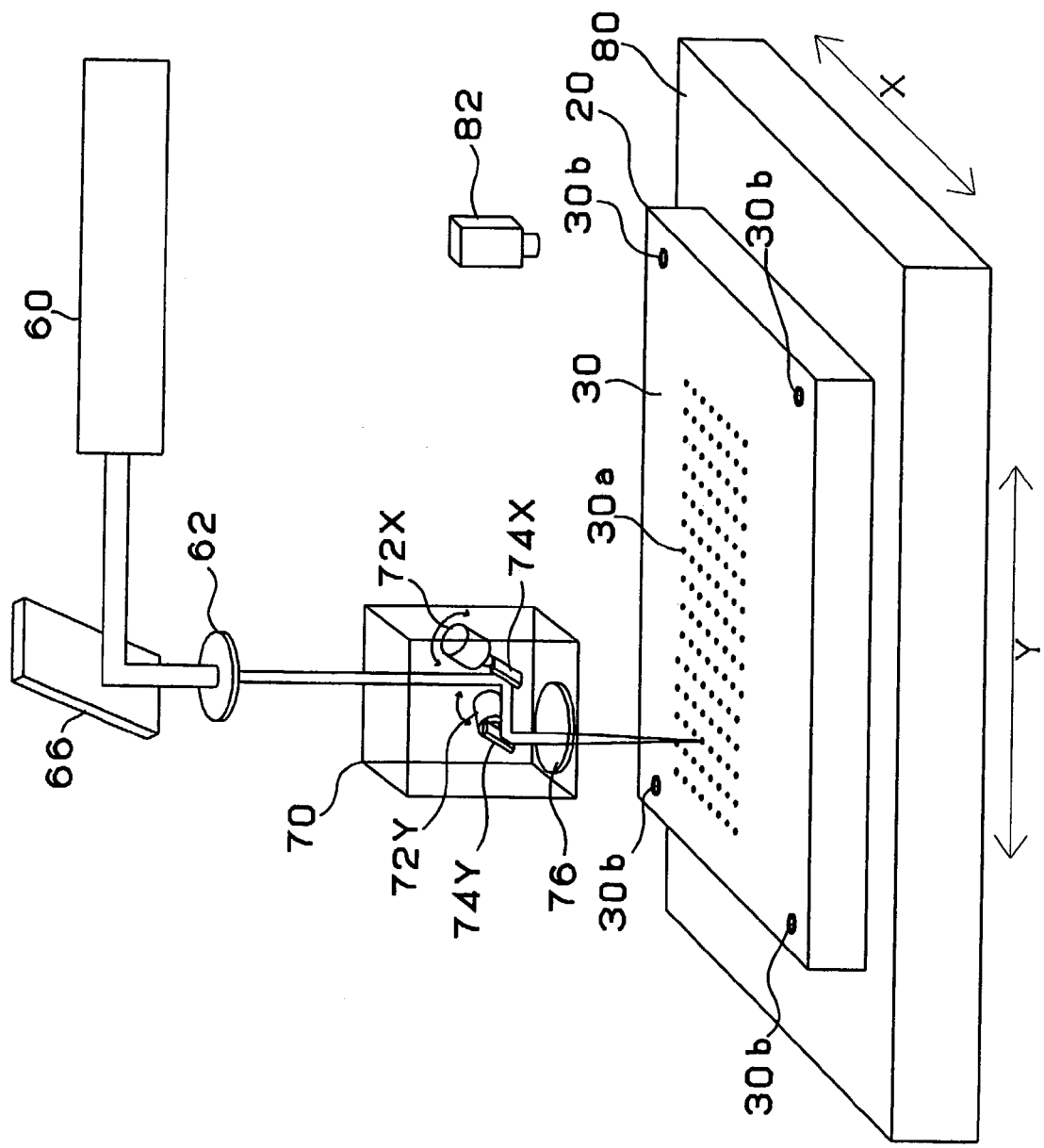
FIG. 1 is a schematic diagram showing the apparatus for producing a multi-layer printed wiring board according to the first embodiment of the present invention.

The first embodiment of the present invention employs an apparatus as shown in FIG. 1 for production of a multi-layer printed wiring board.

In this embodiment, a $CO_2$ laser emitter 60 generates a laser beam. The laser beam is reflected by a mirror 66 and transmitted to a galvano head 70 through a transfer mask 62 for sharp focusing on the board.

The galvano-head (scanning head) 70 is composed of a set of galvano-mirrors including; a galvano-mirror 74X for scanning the laser beam in an X direction and a galvano-mirror 74Y for scanning the beam in a Y direction. Control motors 72X, 72Y drive these mirrors 74X, 74Y. The motors 72X, 72Y adjust the angles of the mirrors 74X, 74Y depending on the control command from the computer (to be explained later), and also transmit the detection signal from the built-in encoder to the computer side.

The scan area of the galvano-mirror is 30×30 mm. Moreover, the positioning velocity of the galvano-mirror is 400 points/sec within the scanning area. The laser beam is respectively scanned in X-Y directions through the galvano-mirrors 74X, 74Y and passes the f-θ lens 76 and collides with the aperture 30a of the metal layer of a substrate 20 (to be explained later) to form a via hole (aperture).

The substrate 20 is placed on the X-Y table 80 moving in X-Y directions. As explained above, since the scanning area of the galvano-mirror of each galvano-head 70 is 30 mm×30 mm and the substrate 20 of 500 mm×500 mm is used, the number of step areas of the X-Y table 80 is 289 (17×17). Namely, the processing of the substrate 20 can be completed by repeating the movement of 30 mm in an X direction 17 times, and the movement in a Y direction 17 times, respectively.

The manufacturing apparatus explained above is also provided with a CCD camera 82, therefore the positions of the positioning marks 30b placed on each of the four corners of a substrate 20, are measured to start processing after compensating for errors.

Figure 2:
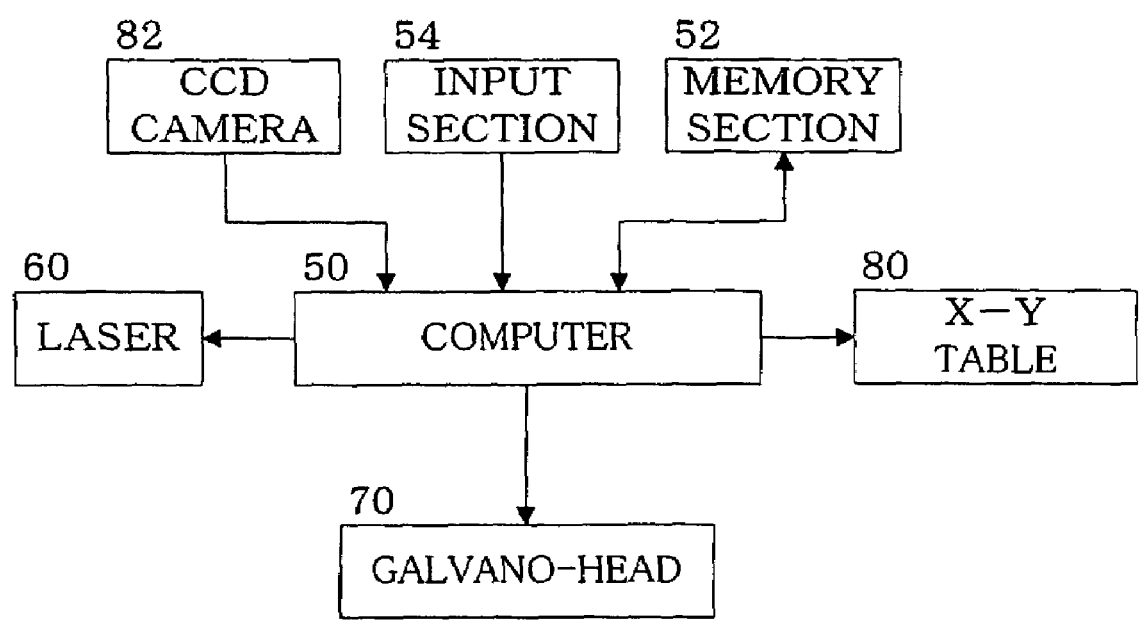
FIG. 2 is a block diagram showing the control system for the production unit shown in FIG. 1.

Subsequently, the control mechanism of this manufacturing apparatus will be explained with reference to FIG. 2.

The control apparatus comprises of a computer 50 which processes and receives, hole coordinate data (processing data) of the multilayer printed wiring board, obtained from the input section 54, and the position of the positioning mark 30b measured by the CCD camera 82 to generate the processing data to be stored in the memory section 52. The actual boring process can be conducted by driving the X-Y table 80, laser 60, and the galvano-head 70, on the basis of the processing data.

Figure 3:
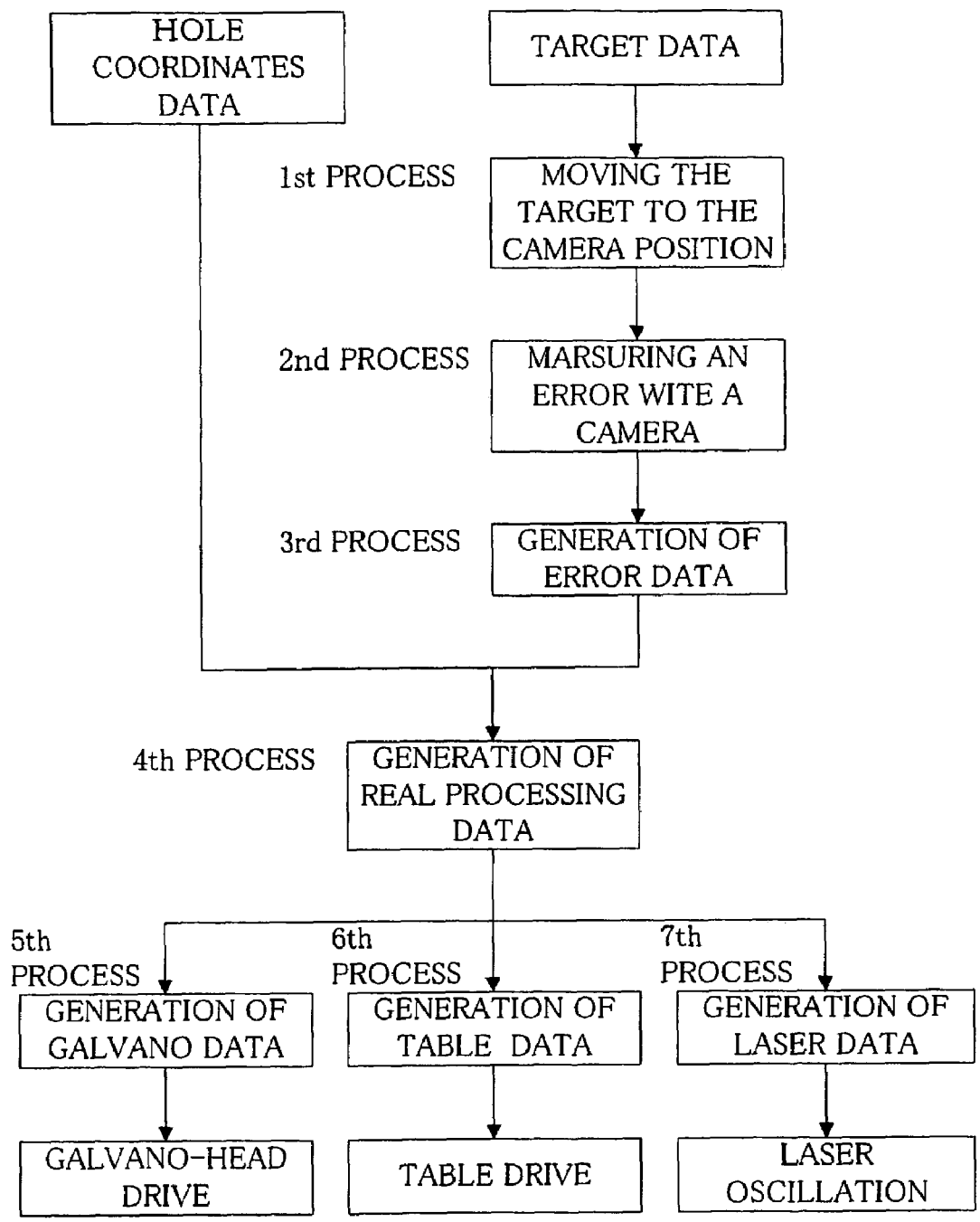
FIG. 3 is a flow diagram showing processing by the control system shown in FIG. 2.
Figure 4:
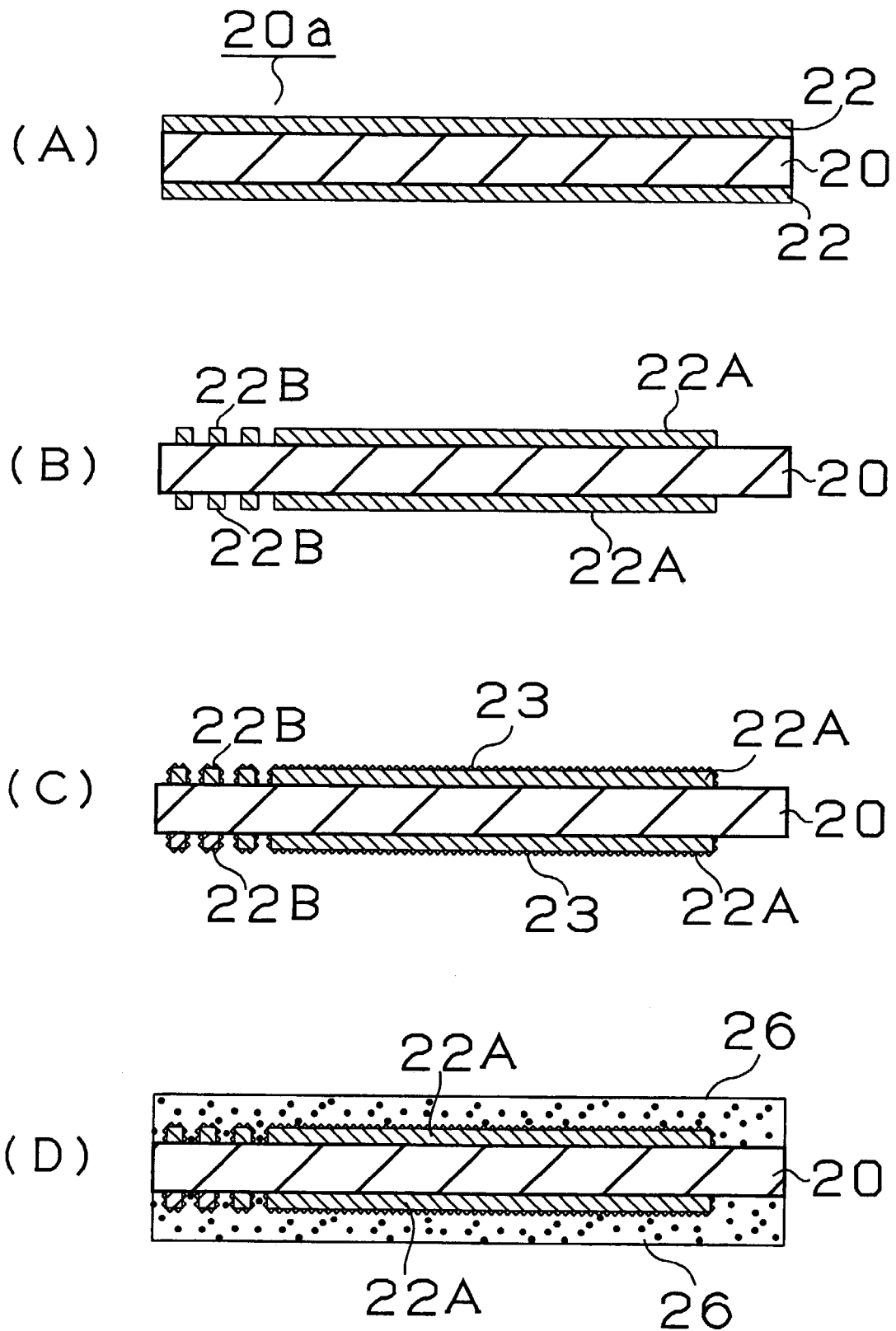
FIGS. 4(A) to 4(D) are diagrams showing the process of producing a printed wiring board according to the first embodiment of the present invention.
Figure 5:
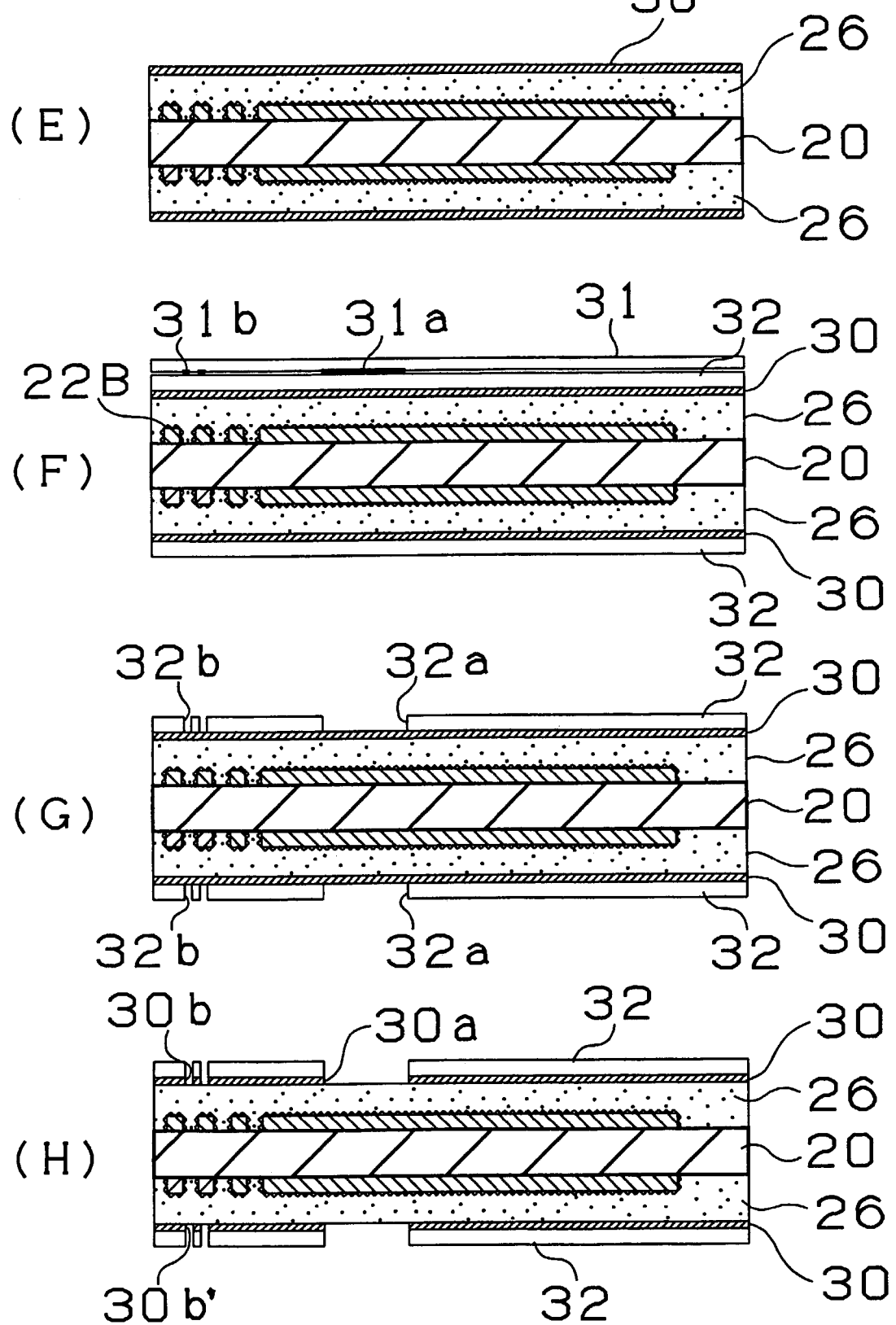
FIGS. 5(E) to 5(H) are diagrams showing the process of producing a printed wiring board according to the first embodiment of the present invention.
Figure 6:
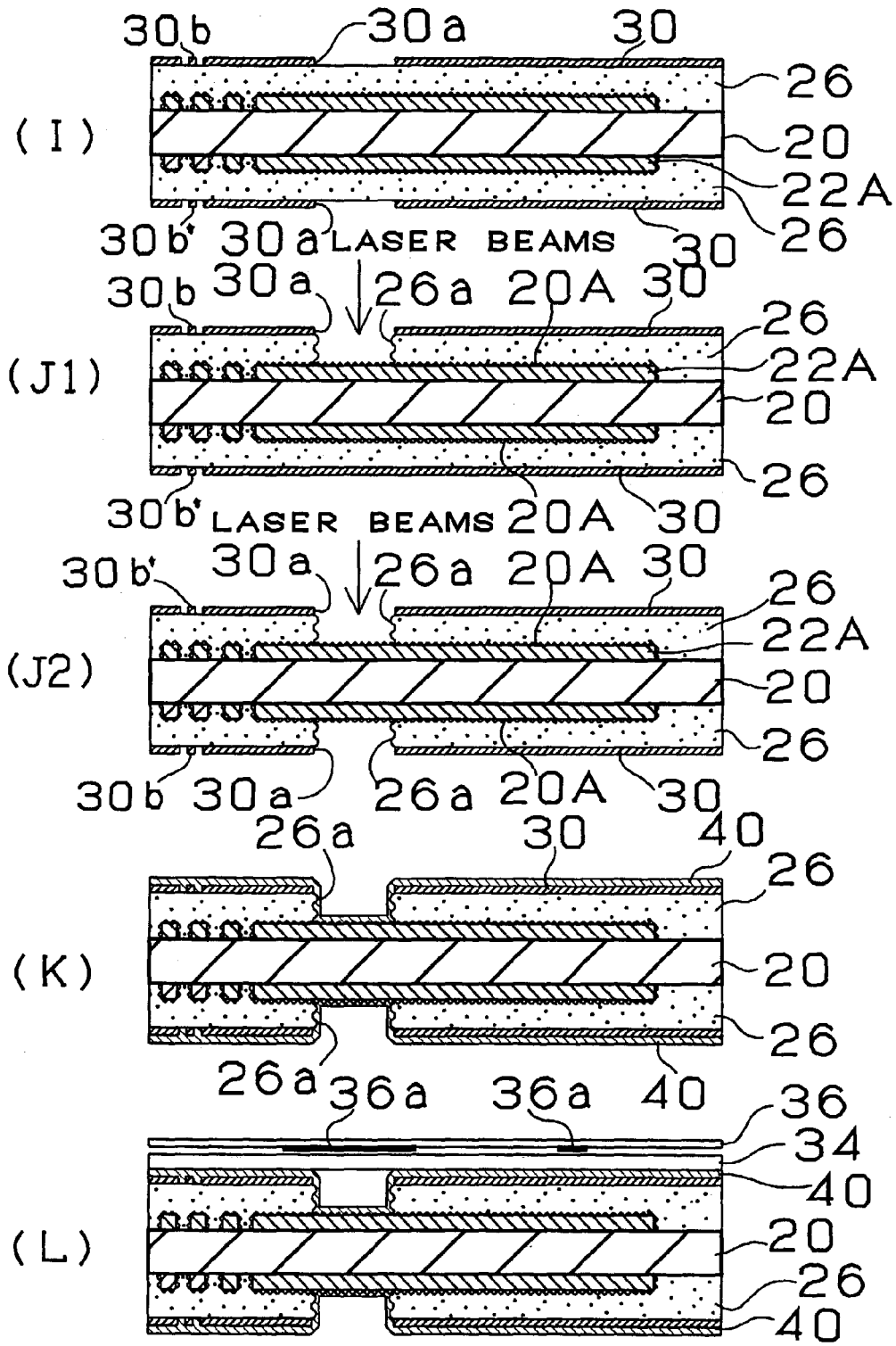
FIGS. 6(I) to 6(L) are diagrams showing the process of producing a printed wiring board according to the first embodiment of the present invention.
Figure 7:
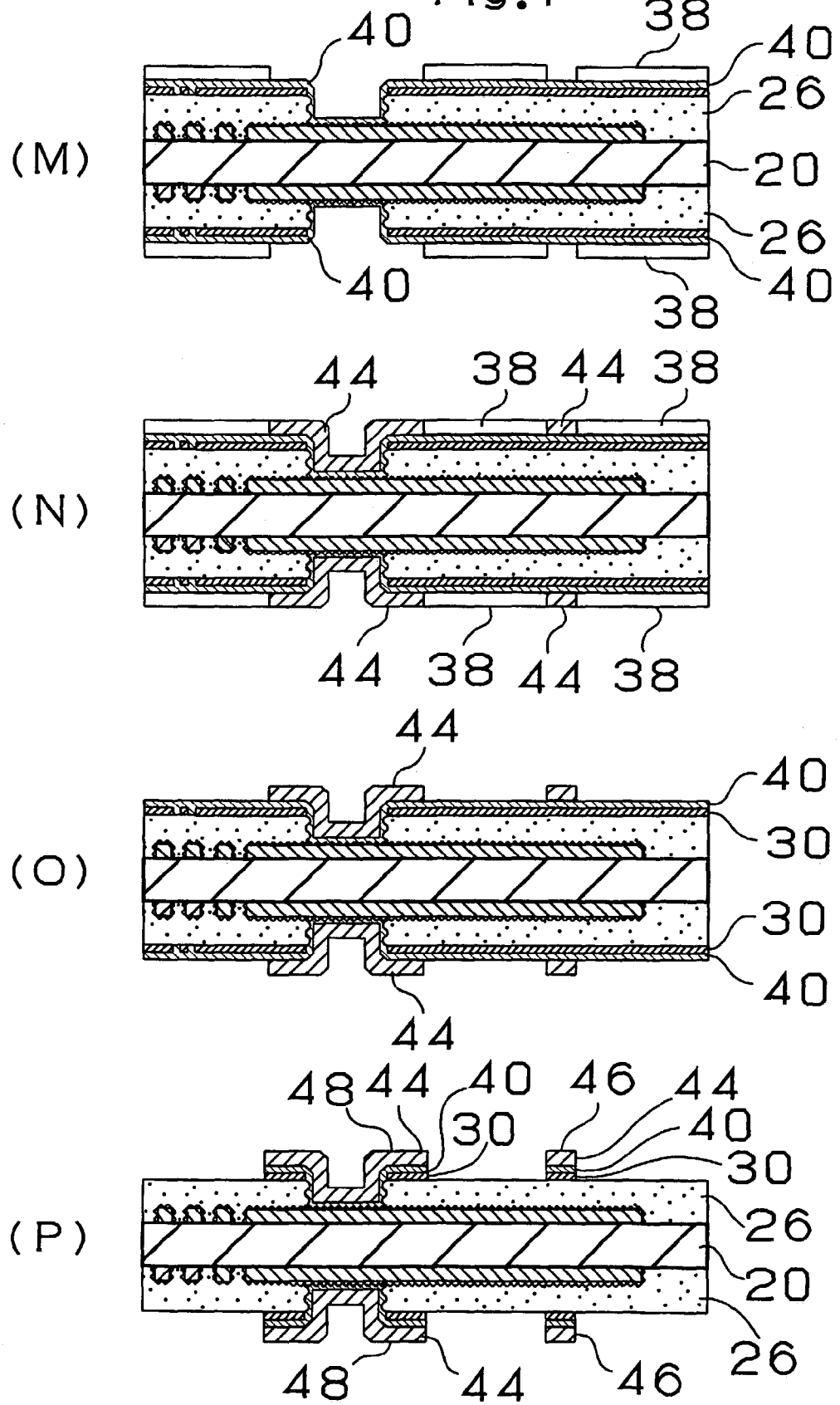
FIGS. 7(M) to 7(P) are diagrams showing the process of producing a printed wiring board according to the first embodiment of the present invention.

Here, the processing data generating process by the computer 50 will be explained in further detail with reference to FIG. 3.

First the computer 50 drives the X-Y table 80 to align the CCD camera 82, with the positioning mark 30b (first process). Errors such as deviation in the X direction, deviation in the Y direction, the compression amount of the substrate and the amount of rotation are measured by calculating locations of the four positioning marks 30b with the CCD camera 82 (second process). Here, error data is generated for correcting any errors of measurement (third process).

Subsequently, the computer 50 corrects the hole coordinate data consisting of the coordinates of respective holes with the error data generated in the third process to generate the actual processing data consisting of the coordinates of the holes actually bored (fourth process). On the basis of the actual processing data, the galvano-head data for driving the galvano-head 70 is generated (fifth process), the table data for driving the X-Y table is generated (sixth process), and the laser data for the timing of oscillating the laser 60 is also generated (seventh process). This data is temporarily stored in the memory section 52 as explained above and the actual boring process is conducted by driving the X-Y table 80, laser 60, and galvano-head 70 depending on this data.

In the first embodiment, printed wiring boards are produced according to steps sequentially explained below with reference to FIGS. 4 to 7.

(1) The base material is a copper-clad laminate 20a. See FIG. 4(A). It is a 1-mm thick board 20 of glass epoxy resin or BT resin (bismaleimide triazine), having both sides thereof laminated with 18-μm thick copper foil 22. The copper foil is pattered by etching using the standard method, to form a copper pattern 22A and a register mark 22B on each side of the board. In actuality, there are four register marks. See FIG. 4(B).

(2) After washing with water and drying, the board 20 undergoes acid degreasing and soft etching. It is then treated with a catalyst solution composed of palladium chloride and organic acid. The Pd-activated board 20 undergoes electroless plating, so that the copper pattern 22A is covered with a 2.5-μm thick layer of Ni—P—Cu alloy, which has a rough surface 23. See FIG. 4(C).

This is proceeded by rinsing and dipping in an electroless plating bath, containing a tin borofluoride-thiourea solution, at 50° C. for 1 hour, so that the rough surface 23 is covered with a 0.3-μm thick tin-substituted plating layer (not shown).

(3) The board 20 is hot-pressed between two 20-μm thick fluoroplastic sheets ("Teflon" from DuPont) under a pressure of 20 kg/cm² at 300° C. for 30 minutes, so as to form the interlayer insulating resin layers 26. See FIG. 4(D).

The fluoroplastic sheet may be replaced by any known adhesive for electroless plating or by any known resin such as polyphenylene sulfide (PPS), polyether ether ketone (PEEK), polyester, epoxy resin, bismalimide-triazine (BT), etc. In the case of the former, a metal film as a conformal mask (mentioned later) is formed by electroless plating as a matter of course.

The insulating resin layer 26 undergoes DC sputtering with a Cu target in argon, so that a 0.5-μm thick Cu layer (metal film) 30 is formed thereon. See FIG. 5(E). Cu may be replaced by aluminum, chromium, or iron.

In addition, sputtering by physical vapor deposition may be replaced by vacuum vapor deposition or chemical vapor deposition. In the case where the interlayer insulating resin layer 26 is formed from an adhesive for electroless plating, the metal film is formed by electroless plating.

(4) The Cu layer 30 is covered with a commercial photosensitive dry film 31, which is subsequently exposed to light (100 mJ/cm$^2$) through a mask 31 placed thereon which has a black spot 31a (for a via hole) and a black spot 31b (for a register mark). See FIG. 5(F). Alignment of the mask 31 with the board 20 is achieved by aligning the mark 31b on the mask 31 with the register mark 22B on the board 20 by with the use of an X-ray camera (not shown). An alternative way of alignment is by the use of a CCD camera, in which the register mark 22B is made visible by making an opening in the Cu layer 30 just above it. In this case the register mark 22B functions also as the register mark 22B shown in FIGS. 11 and 12, which is used to determine the position of the board and hence to calculate the position for laser irradiation, as mentioned later.

After exposure, a photosensitive dry film is developed with 0.8% sodium carbonate solution. In this way there is obtained a 15-μm thick etching resist 32 which has an opening 32a for a via hole and an opening 32b for a register mark. See FIG. 5(G).

(5) Etching with an aqueous solution of sulfuric acid and hydrogen peroxide is performed through the etching resist 32, so that the Cu layer 30 is partly removed at the opening 32a for the via hole and the opening 32b for the register mark. Thus, an opening 30a (20 μm in diameter) and register marks 30b and 30b' are formed. See FIG. 5(H). The etching resist 32 is removed with an aqueous solution of sodium hydroxide. See FIG. 6(I). The thus obtained board 20, which has openings 30a and register marks 30b is shown in FIG. 8(A). In FIG. 6(I), two register marks 30b and 30b' are shown on either side; in actuality, however, the register marks 30b and 30b' are positioned on the four corners of the board 20 as shown in FIG. 1. The register marks 30b shown here are annular, but it they may also be square as shown in FIG. 8(b).

(6) The board 20 is placed on an X-Y table 80 shown in FIG. 1. The position of the board 20 is determined and corrected with the aid of the register marks 30b thereon, which are sensed by the CCD camera 82. The board is subjected to laser pulses (50 μs) from the laser emitter 60 (400W output and 10.6 μm wavelength). That part of the resin 26 which is exposed to these laser pulses through the openings 30a in the Cu layer 30 is removed. As a result, an opening 26a (20 μm in diameter) for a via hole is formed, through which the copper pattern 22A is partly exposed. See FIG. 6(J1). In other words, the Cu layer (0.5 μm thick) is used as a conformal mask when the opening 26a for a via hole is formed by a laser beam. In this embodiment, the $CO_2$ laser beam is directed to the openings 30a one by one. The board 20 is reversed. The position of the board 20 is determined and corrected with the aid of the register marks 30b' thereon which are sensed by the CCD camera 82. The board is subjected to laser pulses, and that part of the resin 26 which is exposed to these laser pulses through the opening 30a in the Cu layer 30 is removed. As a result, an opening 26a (20 μm in diameter) for the via hole is formed. See FIG. 6(J2).

Incidentally, the beam should ideally have a diameter larger than 1.3 times the diameter (20 μm) of the opening, so as to ensure that the laser beam drills a via hole through the opening 26a even in the case where the position of the laser beam is slightly dislocated. It follows that the accuracy of the position of the via hole (or the accuracy of the position of the opening 26a for the via hole relative to the register mark 30b) depends on the accuracy of the position of the opening 30a for the via hole relative to the register mark 30b formed on the Cu layer 30 as the conformal mask. Therefore, this embodiment makes it possible to form the via hole at an adequate position even in the case of low accuracy in the laser beam positioning.

In this embodiment, 5000 holes are bored at random on the substrate (500 mm×500 mm) with a laser beam. Here, as explained above, the scanning area of the galvano-mirror is 30×30 mm and the positioning velocity is 400 points/sec in the scanning area. On the other hand, the number of step areas of the X-Y table is 298 (17×17). Namely, the laser process is completed by repeating the movement of 30 mm in the X direction 17 times and the movement of 30 mm in the Y direction 17 times. The moving velocity of the X-Y table 80 is 15000 mm/min. Meanwhile, the processing time of the four positioning marks 30b by the CCD camera 82 is 9 seconds including the moving time of the table 80. When the substrate 20 is processed by such manufacturing apparatus, the manufacturing time is 269.5 seconds.

(7) The board 20, with the opening 26a formed therein, is dipped in chromic acid for one minute for its de-smearing treatment. Then, the board 20 is dipped in a neutralizing solution (from Shiplay Corp.) and rinsed. Instead of dipping in chromic acid, it is also possible to remove residues from the opening 26a by dipping in potassium permanganate solution or by treatment with $O_2$ plasma, $CF_4$ plasma, or $O_2$—$CF_4$ mixture gas plasma.

(8) The board 20 is given a palladium catalyst (from Atotech Corp.) and then dipped in an electroless copper plating solution of the following composition so as to form a 0.5-μm thick copper film 40 on the Cu layer 30 and inside the opening 26a for the via hole. See FIG. 6(K).

| Composition of electroless plating solution | |
| --- | --- |
| EDTA | 150 g/l |
| Copper sulfate | 20 g/l |
| HCHO | 30 ml/l |
| NaOH | 40 g/l |
| α,α'-bipyridyl | 80 mg/l |
| PED | 0.1 g/l |

(9) The Cu film 40 (formed by electroless plating) is covered with a commercial photosensitive dry film 34, which is subsequently exposed to light (100 mJ/cm$^2$) through a mask 36 placed thereon which has black spots 36a at prescribed positions. See FIG. 6(L). Exposure is followed by development with 0.8% sodium carbonate solution, which removes the unexposed section. In this way there is obtained a 15-μm thick etching resist 38. See FIG. 7(M).

(10) Electrolytic copper plating is performed under the following conditions so as to form a 15-μm thick copper layer 44. See FIG. 7(N).

| Electrolytic plating solution | |
| --- | --- |
| Sulfuric acid | 180 g/l |
| Copper sulfate | 80 g/l |
| Additive | 1 ml/l |

(11) The resist 38 is removed by treatment with 5% KOH solution. See FIG. 7(O). Etching with a mixture of sulfuric acid and hydrogen peroxide is performed to dissolve and remove the Cu layer 30 and the plated copper film 40, which are under the resist 38. In this way there are formed a conductor circuit 46 and a via hole 48 (both 16 μm thick), each consisting of a Cu layer 30, electrolessly plated copper film 40, and an electrolytically plated copper layer 44. See FIG. 7(P). The board is then dipped in chromic acid solution (800 g/l) at 70° C. for three minutes until the interlayer insulating resin layer 26 between the conductor circuits is etched to a depth of 1 μm and the surface thereof is cleaned of residual palladium catalyst. This treatment is necessary to ensure insulation between conductor circuits. (For convenience, only one conductor circuit 46 is shown in the figure although an actual printed wiring board has a number of conductor circuits.) In this way it is possible to form a fine conductor circuit 46 about 20 μm wide. By repeating the above-mentioned steps and building up the wiring layer, it is possible to complete a multi-layer printed wiring board.

In this embodiment, the Cu layer 30 as the conformal mask is formed by sputtering on the interlayer insulating resin layer 26. This means that it is possible to make the conformal mask 30 thin with good adhesion to the interlayer insulating resin layer 26. The advantage of having such a thin conformal mask 30, is that it can be easily removed by etching when the conductor circuit 46 and the via hole 48 are formed, hence there is no possibility of the etching severely damaging the electrolytically plated copper layer 44 which forms the conductor circuit 46 and the via hole 48. This results in wiring with a fine pitch and via holes with an extremely small diameter.

Incidentally, the Cu layer 30 formed by sputtering and the film 40 formed by electroless plating should ideally be thinner than 2.0 μm so that they undergo etching easily when their unnecessary parts are removed.

The above-mentioned embodiment may be modified by replacing the galvano head for scanning with a polygon mirror and replacing the $CO_2$ laser with any other laser. Also, instead of directing a laser beam to the opening 30*a* of the Cu layer 30 one by one in the above-mentioned embodiment, it is possible to scan the entire surface of the board with a laser beam so that the resin 26 under the opening 30*a* is removed.

Figure 9:
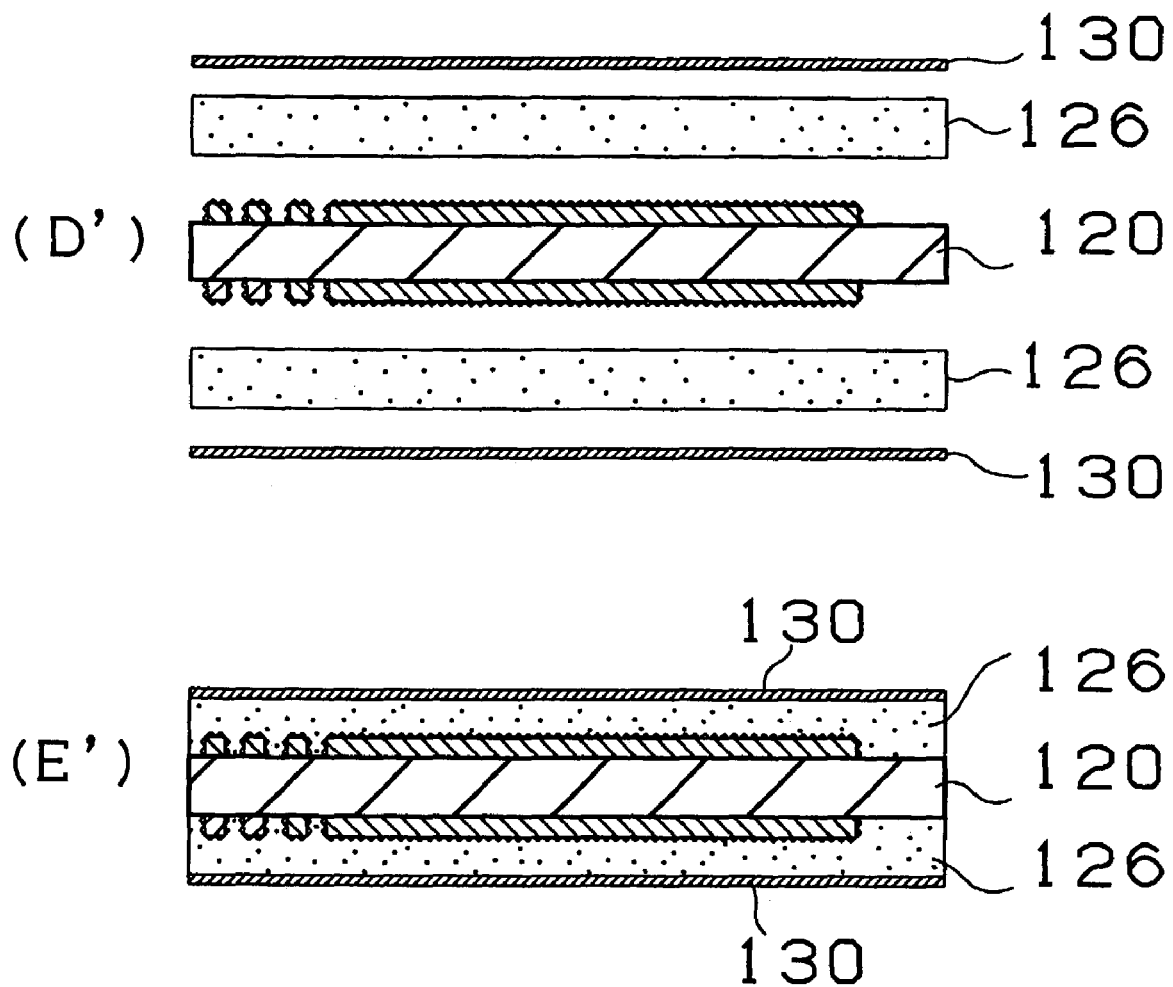
FIGS. 9(D') and 9(E') are diagrams showing the process of producing a printed wiring board according to the first embodiment (with modification) of the present invention.

Instead of forming the interlayer insulating resin layer and the metal film sequentially in the above-mentioned embodiment, it is also possible to form them simultaneously. In this case, the steps shown in FIGS. 4(D) and 5(E) are replaced by those shown in FIGS. 9(D') and 9(E'). In the step shown in FIG. 9(D'), the board 120 is laminated with a prepreg 126 and a metal foil 130. In the process shown in FIG. 9(E'), these layers are bonded together through curing by hot pressing. (The prepreg is a glass fiber cloth or aramid fiber cloth impregnated with a resin in B stage. A resin film may replace it in B stage.)

Figure 10:
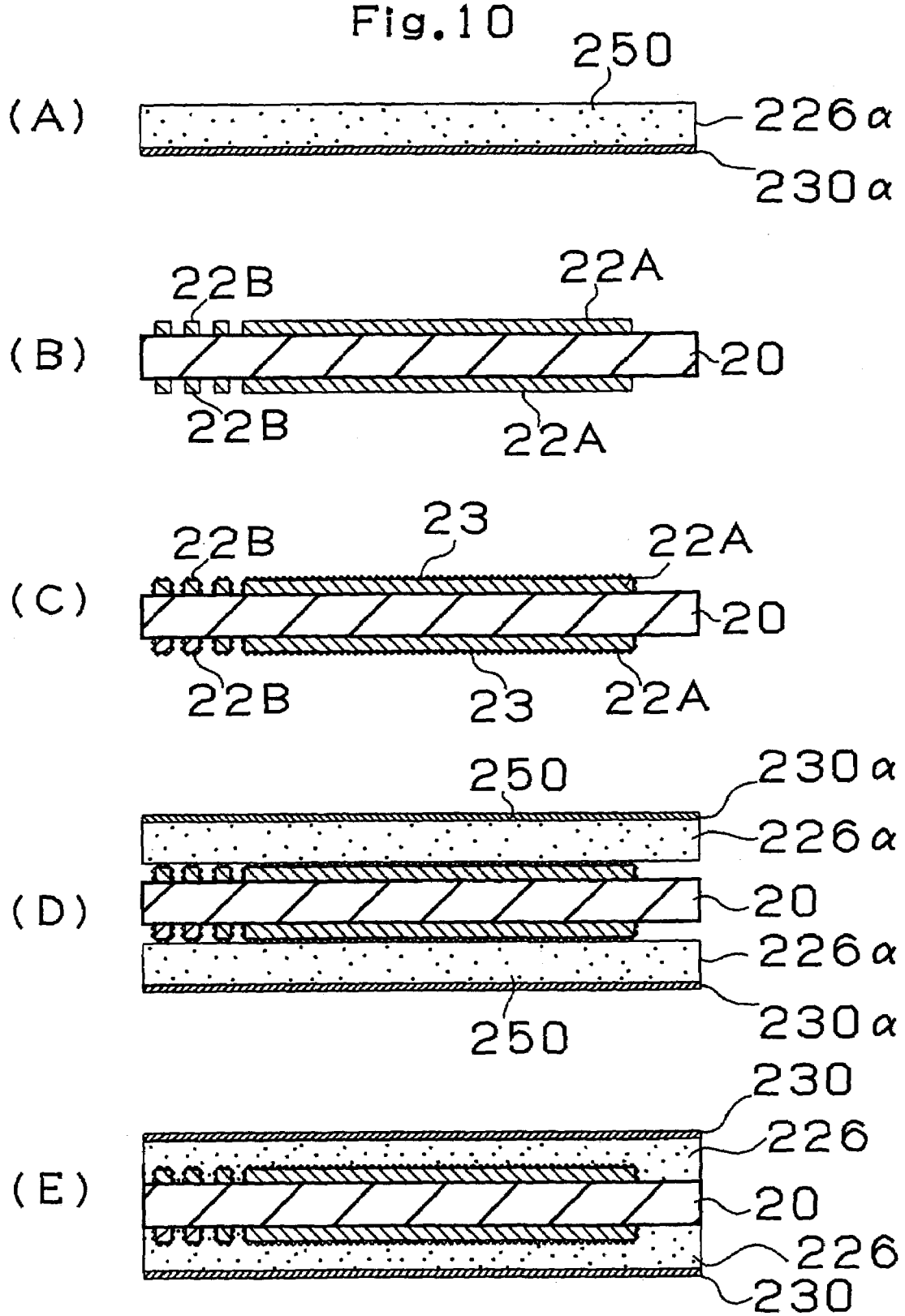
FIGS. 10(A) to 10(E) are diagrams showing the process of producing a printed wiring board according to the first embodiment (with another modification) of the present invention.

Another embodiment in which the interlayer insulating resin layer and the metal film are formed simultaneously is explained below with reference to FIG. 10.

(1) A 9-μm thick copper foil 230 is coated on one side thereof with an epoxy resin of cresol-novolak type. By heating at 60° C. for three hours, the resin is converted into B-stage resin 226. Thus there is obtained a resin film 250. See FIG. 10(A).

(2) On both sides of the board 20 an internal layer copper pattern 22A, and a register mark 22B, are formed in the same manner as in step (1) of the first embodiment, which was explained above with reference to FIG. 4(B). See FIG. 10(B).

(3) On the surface of the internal layer copper pattern 22A a 2.5-μm thick Ni—P—Cu ally layer with a rough surface is manifested in the same manner as in step (2) of the first embodiment, which was explained above with reference to FIG. 4(C). See FIG. 10(B). On this rough surface a 0.3-μm thick tin-substituted plating layer is created (not illustrated).

(4) The board 20 is sandwiched between two pieces of the resin film 250, which has been prepared in step (1). See FIG. 10(D). The resulting laminate is hot-pressed at 120° C. for one hour and at 150° C. for three hours under a pressure of 10 kg/cm$^2$. In this way there are formed the interlayer insulating resin layer 26 and the metal film 230. See FIG. 10(E).

(5) A multi-layer printed circuit board is produced in the same manner as in steps (4) to (11), which were explained above with reference to FIG. 5(E) to FIG. 7(P).

Another example of a modified embodiment will be explained with reference to FIGS. 11 and 12.

It is characterized by the register mark 30*b* being circular instead of annular (as in the previous embodiment) and the mark 230B also being circular.

The board 20 is provided with a sub-layer mark 220B and a conductor circuit 22A, as shown in FIG. 11(B). The sub-layer mark 220B and the conductor circuit 22A have their surfaces roughened, as shown in FIG. 11(C). The copper-clad resin film 250, which is shown in FIG. 11(A), is laminated as shown in FIG. 11(D). The laminate is heat-pressed to form the interlayer insulating resin layer 226 and the metal film 230, as shown in FIG. 11(E). The copper foil 30 is etched to form an opening 30*b* for the register mark and an opening 30*a* for the via hole, as shown in FIG. 12(F).

The sub-layer mark 220B under the register mark 30*b* is viewed by the CCD camera 82 through the resin layer 226 to determine and correct the position of the board 20, as shown in FIG. 12(G). A laser beam is directed at the opening 30*a* in the Cu layer 30 so as to remove that part of the resin layer 226 which is exposed through it. This process creates an opening 26*a* (20 μm in diameter) for the via hole, as shown in FIG. 12(H). Being covered with the resin 26, the sub-layer mark 220B does not oxidize to decrease in reflectivity, nor does it peel off (hence it poses no problem with recognition in silhouette). In this embodiment, therefore, it is possible to determine and correct the position of the board 20 relative to the sub-layer mark 220B and to control the direction of the laser beam relative to the register mark 30*b*.

The sub-layer 220B is an index for the position of the internal layer pad to which the via hole is connected, and the register mark 30*b* is an index for the position of the via hole.

Therefore, if the sub-layer mark 220B and the register mark 30b are excessively dislocated relative to each other, it follows that the via hole will not connect to the internal layer pad. Measuring the amount of relative dislocation makes it possible to detect defects during the fabricating process.

EXPLOITATION IN INDUSTRY

As explained above, the present invention ensures the accurate positioning of the opening for a via hole even in the case of the laser beam aiming with low accuracy. This is advantageous to mass production of multi-layer printed wiring boards, which require hundreds to thousands of holes to be drilled by laser beams.

In addition, the present invention permits the laser scanning head to operate faster with low accuracy for the position of laser aiming without sacrificing the accuracy for sensing the position of the opening for a via hole. The result is an increase in the number of openings to be formed per unit time, hence increasing productivity.

The invention claimed is:

1. A process for producing a multi-layer printed wiring board which comprises:
   (a) removing a metal film covering a surface of an interlayer insulating resin layer to form openings and a register mark on a board covered with a conductor layer;
   (b) placing said board covered with the conductor layer with said register mark on a table of an apparatus for producing a multi-layer printed wiring board, said apparatus including an emitter of fabricating laser, a scanning head to deflect direction of a laser beam in X-Y directions, a camera to read said register mark on the board, the table to support the board covered with the conductor layer, an entry part for entrance of processing data for the board covered with the conductor layer, a memory to store the processing data or computed results, and an operation part;
   entering the processing data into said apparatus;
   reading a position of the register mark which is formed by removing the metal film on a surface of the board covered with the conductor layer by said camera, measuring the position of the register mark, making data of a result of a measurement, comparing the data of the measurement with previously entered processing data thereby generating real processing data necessary to drive said scanning head and said table, and storing the real processing data in the memory;
   irradiating the openings which is formed by removing said metal film with a laser beam, with said scanning head and table controlled by a control part which reads the real processing data from the memory, thereby removing said interlayer resin layer to form openings through which via holes are created; and
   (c) forming via holes and conductor circuits.

2. A process for producing a printed wiring board according to claim 1, wherein said step (b) further comprises:
   measuring an aberration of the position of the register mark by said camera, making data of a result of a measurement, and making an aberration compensation data for compensating the measured aberration based on the result of the measurement in the operation part; and
   modifying a hole coordinate data consisting of a coordinate of the holes in the processing data, thereby generating real processing data comprising of a coordinate of the holes to be really opened.

3. A process for producing a printed wiring board according to claim 1, wherein said step (a) further comprises removing the metal film by an etching process.

4. A process for producing a printed wiring board according to claim 1, further comprising:
   forming a lower register mark consisting a lower metal film on the board covered with the conductor layer, the interlayer insulating resin layer covered with an upper metal film being placed on the lower register mark;
   removing the upper metal film to form an upper register mark placed above the lower register mark; and
   reading the lower register mark through the upper register mark by said camera.

5. A process for producing a printed wiring board according to claim 1, wherein:
   the metal film on the interlayer insulating resin layer and the conductor layer are connected with the via holes; and
   said via holes are comprising two metal films.

6. A process for producing a printed wiring board according, to claim 1, wherein:
   the metal film on the interlayer insulating resin layer and the conductor layer are connected with the via holes; and
   said via holes are comprising a lower electrolessly plated film and an upper electrolytic plated film.

7. A process for producing a multi-layer printed wiring board, which comprises:
   (a) forming an interlayer insulating resin layer on a board covered with a conductor layer;
   (b) removing a metal film covering a surface of the interlayer insulating resin layer to form openings and a register mark;
   (c) placing said board covered with the conductor layer with said register mark on a table of an apparatus for producing a multi-layer printed wiring board, said apparatus including; an emitter of fabricating laser, a scanning head to deflect direction of a laser beam in X-Y directions, a camera to read said register mark on the board, the table to support the board covered with the conductor layer, an entry part for entrance of processing data for the board covered with the conductor layer, a memory to store the processing data or computed results, and an operation part;
   entering processing data into said apparatus;
   reading a position of the register mark which is formed by removing the metal film on a surface of the board covered with the conductor layer by said camera, measuring the position of the register mark, making data of a result of a measurement, comparing the data of the measurement with previously entered processing data thereby generating real processing data necessary to drive said scanning head and said table, and storing the real processing data in the memory; and
   irradiating the openings which is formed by removing said metal film with a laser beam, with said scanning head and table controlled by a control part which reads the real processing data from the memory, thereby removing said interlayer resin layer to form openings through which via holes are created.

8. A process for producing a printed wiring board according to claim 7, wherein said step (c) further comprises:
   measuring an aberration of the position of the register mark by said camera, making data of a result of a measurement and making an aberration compensation data for compensating the measured aberration based on the result of the measurement in the operation part; and modifying a hole coordinate data consisting of a coordinate of the holes in the processing data, thereby generating real processing data comprising of a coordinate of the holes to be really opened.

9. A process for producing a printed wiring board according to claim 7, wherein said step (b) further comprises removing the metal film by etching process.

10. A process for producing a printed wiring board according to claim 7, further comprising:
    forming a lower register mark consisting a lower metal film on the board covered with the conductor layer, the interlayer insulating resin layer covered with an upper metal film being placed on the lower register mark;
    removing the upper metal film to form an upper register mark placed above the lower register mark; and
    reading the lower register mark through the upper register mark by said camera.

11. A process for producing a printed wiring board according to claim 7, wherein:
    the metal film on the interlayer insulating resin layer and the conductor layer are connected with the via holes; and
    said via holes are comprising two metal films.

12. A process for producing a printed wiring board according to claim 7, wherein:
    the metal film on the interlayer insulating resin layer and the conductor layer are connected with the via holes; and
    said via holes are comprising a lower electrolessly plated film and an upper electrolytic plated film.

13. A process for producing a multi-layer printed wiring board, which comprises:
    (a) placing a metal-clad resin film on a board covered with a conductor layer and performing hot-pressing, thereby forming an interlayer insulating resin layer covered with a metal film on surface thereof;
    (b) removing the metal film to form openings and register mark;
    (c) placing said board covered with the conductor layer with said register mark on a table of an apparatus for producing a multi-layer printed wiring board, said apparatus including; an emitter of fabricating a laser, a scanning head to deflect direction of a laser beam in X-Y directions, a camera to read said register mark on the board, the table to support the board covered with the conductor layer, an entry part for entrance of processing data for the board covered with the conductor layer, a memory to store the processing data or computed results, and an operation part;
    entering the processing data into said apparatus;
    reading a position of the register mark which is formed by removing the metal film on the board covered with the conductor layer by said camera, measuring the position of the register mark, making data of a result of a measurement, comparing the data of the measurement with previously entered processing data thereby generating real processing data necessary to drive said scanning head and said table, and storing the real processing data in the memory;
    irradiating the openings which is formed by removing said metal film with a laser beam, with said scanning head and table controlled by a control part which reads the real processing data from the memory, thereby removing said interlayer resin layer to form openings through which via holes are created; and
    (d) forming via holes and conductor circuits.

14. A process for producing a printed wiring board according to claim 13, wherein said step (c) further comprises:
    measuring an aberration of the position of the register mark by said camera, making data of a result of a measurement, and making an aberration compensation data for compensating the measured aberration based on the result of the measurement in the operation part; and
    modifying a hole coordinate data consisting of a coordinate of the holes in the processing data, thereby generating real processing data comprising of a coordinate of the holes to be really opened.

15. A process for producing a printed wiring board according to claim 13, wherein said step (b) further comprises removing the metal film by etching process.

16. A process for producing a printed wiring board according to claim 13, further comprising:
    forming a lower register mark consisting a lower metal film on the board covered with the conductor layer, the interlayer insulating resin layer covered with an upper metal film being placed on the lower register mark;
    removing the upper metal film to form an upper register mark placed above the lower register mark; and
    reading the lower register mark through the upper register mark by said camera.

17. A process for producing a printed wiring board according to claim 13, wherein:
    the metal film on the interlayer insulating resin layer and the conductor layer are connected with the via holes; and
    said via holes are comprising two metal films.

18. A process for producing a printed wiring board according to claim 13, wherein:
    the metal film on the interlayer insulating resin layer and the conductor layer are connected with the via holes; and
    said via holes are comprising a lower electrolessly plated film and an upper electrolytic plated film.

19. A process for producing a multi-layer printed wiring board, which comprises:
    (a) forming an interlayer insulating resin layer on a board covered with a conductor layer;
    (b) forming a metal film covered with surface of said interlayer insulating resin layer;
    (c) removing the metal film to form openings and a register mark;
    (d) placing said board covered with the conductor layer with said register mark on a table of an apparatus for producing a multi-layer printed wiring board, said apparatus including an emitter of fabricating laser, a scanning head to deflect direction of a laser beam in X-Y directions, a camera to read said register mark on the board, the table to support the board covered with the conductor layer, an entry part for entrance of processing data for the board covered with the conductor layer, a memory to store the processing data or computed results, and an operation part;
    entering the processing data into said apparatus;
    reading a position of the register mark which is formed by removing the metal film on a surface of the board covered with the conductor layer by said camera, measuring the position of the register mark, making data of a result of a measurement, comparing the data of the measurement with previously entered processing data thereby generating real processing data necessary to drive said scanning head and said table, and storing the real processing data in the memory;

irradiating the openings which is formed by removing said metal film with a laser beam, with said scanning head and table controlled by a control part which the real processing data from the memory, thereby removing said interlayer resin layer to form openings through which via holes are created;

(e) forming an electrolessly plated film on the board obtained in said step (d);

(f) forming a plating resist on the board obtained in said step (e);

(g) performing electrolytic plating on a part where said plating resist is not formed; and (h) removing said plating resist and, removing by etching, said metal film and electrolessly plated film under said plating resist.

20. A process for producing a printed wiring board according to claim 19, wherein said step (d) further comprises:

measuring an aberration of the position of the register mark by said camera, making data of a result of a measurement, and making an aberration compensation data for compensating the measured aberration based on the result of the measurement in the operation part; and modifying a hole coordinate data consisting of a coordinate of the holes in the processing data, thereby generating real processing data comprising of a coordinate of the holes to be really opened.

21. A process for producing a printed wiring board according to claim 19, wherein said step (c) further comprises removing the metal film by etching process.

22. A process for producing a printed wiring board according to claim 19, further comprising:

forming a lower register mark consisting a lower metal film on the board covered with the conductor layer, the interlayer insulating resin layer covered with an upper metal film being placed on the lower register mark;

removing the upper metal film to form an upper register mark placed above the lower register mark; and reading the lower register mark through the upper register mark by said camera.

23. A process for producing a printed wiring board according to claim 19, wherein:

the metal film on the interlayer insulating resin layer and the conductor layer are connected with the via holes; and said via holes are comprising two metal films.

24. A process for producing a printed wiring board according to claim 19, wherein:

the metal film on the interlayer insulating resin layer and the conductor layer are connected with the via holes; and said via holes are comprising a lower electrolessly plated film and an upper electrolytic plated film.

25. A process for producing a multi-layer printed wiring board, which comprises:

(a) forming an interlayer insulating resin layer covered with a metal film on a board covered with a conductor layer;

(b) removing the metal film to form openings and register mark;

(c) placing said board covered with the conductor layer with said register mark on a table of an apparatus for producing a multi-layer printed wiring board, said apparatus including an emitter of fabricating laser, a galvano head to deflect direction of a laser beam in X-Y directions, a camera to read said register mark on the board, the table to support the board covered with the conductor layer, an entry part for entrance of processing data for the board covered with the conductor layer, a memory to store the processing data or computed results, and an operation part;

entering the processing data into said apparatus;

reading a position of the register mark which is formed by removing the metal film on a surface of the board covered with the conductor layer by said camera, measuring the position of the register mark, making data of a result of a measurement, comparing the data of the measurement with previously entered processing data thereby generating real processing data necessary to drive said galvano head and said table, and storing the real processing data in the memory;

irradiating the openings which is formed by removing said metal film with a laser beam, with said galvano head and table controlled by a control part which reads the real processing data from the memory, thereby removing said interlayer resin layer to form openings through which via holes are created; and (d) forming via holes and conductor circuits.

26. A process for producing a printed wiring board according to claim 25, wherein said step (c) further comprises:

measuring an aberration of the position of the register mark by said camera, making data of a result of a measurement, and making an aberration compensation data for compensating the measured aberration based on the result of the measurement in the operation part; and modifying a hole coordinate data consisting of a coordinate of the holes in the processing data, thereby generating real processing data comprising of a coordinate of the holes to be really opened.

27. A process for producing a printed wiring board according to claim 25, wherein said step (b) further comprises removing the metal film by etching process.

28. A process for producing a printed wiring board according to claim 25, further comprising:

forming a lower register mark consisting a lower metal film on the board covered with the conductor layer, the interlayer insulating resin layer covered with an upper metal film being placed on the lower register mark;

removing the upper metal film to form an upper register mark placed above the lower register mark; and reading the lower register mark through the upper register mark by said camera.

29. A process for producing a printed wiring board according to claim 25, wherein:

the metal film on the interlayer insulating resin layer and the conductor layer are connected with the via holes; and said via holes are comprising two metal films.

30. A process for producing a printed wiring board according to claim 25, wherein:

the metal film on the interlayer insulating resin layer and the conductor layer are connected with the via holes; and said via holes are comprising a lower electrolessly plated film and an upper electrolytic plated film.

* * * * *